(12) United States Patent
Park et al.

(10) Patent No.: US 10,096,796 B2
(45) Date of Patent: Oct. 9, 2018

(54) TRANSPARENT DISPLAY DEVICE INCLUDING LIGHT-PASSING SEALING MEMBER

(71) Applicant: SAMSUNG DISPLAY CO., LTD., Yongin-si, Gyeonggi-Do (KR)

(72) Inventors: Byoung-Hee Park, Seoul (KR); Joonyoup Kim, Seoul (KR); Jeongwoo Moon, Suwon-si (KR); Jinkoo Chung, Suwon-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/644,031

(22) Filed: Jul. 7, 2017

(65) Prior Publication Data

US 2018/0013093 A1    Jan. 11, 2018

(30) Foreign Application Priority Data

Jul. 7, 2016   (KR) ......................... 10-2016-0086299

(51) Int. Cl.
*H01L 51/52* (2006.01)
*H01L 27/32* (2006.01)

(52) U.S. Cl.
CPC ...... *H01L 51/5246* (2013.01); *H01L 27/3276* (2013.01); *H01L 51/5284* (2013.01)

(58) Field of Classification Search
CPC ............. H01L 27/3244; H01L 27/3246; H01L 27/3251

See application file for complete search history.

(56) References Cited

U.S. PATENT DOCUMENTS

| 9,069,198 B2 * | 6/2015 | Kim ...................... G06F 1/1686 |
| 2016/0315133 A1 * | 10/2016 | Sato .................... H01L 27/3265 |

FOREIGN PATENT DOCUMENTS

| KR | 10-2007-0042353 | 4/2007 |
| KR | 10-2010-0086782 | 8/2010 |
| KR | 10-2014-0002392 | 1/2014 |
| KR | 10-1530753 | 6/2015 |
| KR | 10-2015-0136052 | 12/2015 |

* cited by examiner

*Primary Examiner* — Quoc Hoang
(74) *Attorney, Agent, or Firm* — F. Chau & Associates, LLC.

(57) ABSTRACT

A transparent display device includes a display substrate having a display region and a sealing region surrounding the display region. The display region includes a plurality of pixel regions, each of which includes a light-emitting region and a transparent region. An opposite substrate faces the display substrate. A sealing member is interposed between the display substrate and the opposite substrate. The sealing member overlaps the sealing region. The sealing member bonds the display substrate to the opposite substrate and includes a plurality of first light openings defined therein.

20 Claims, 13 Drawing Sheets

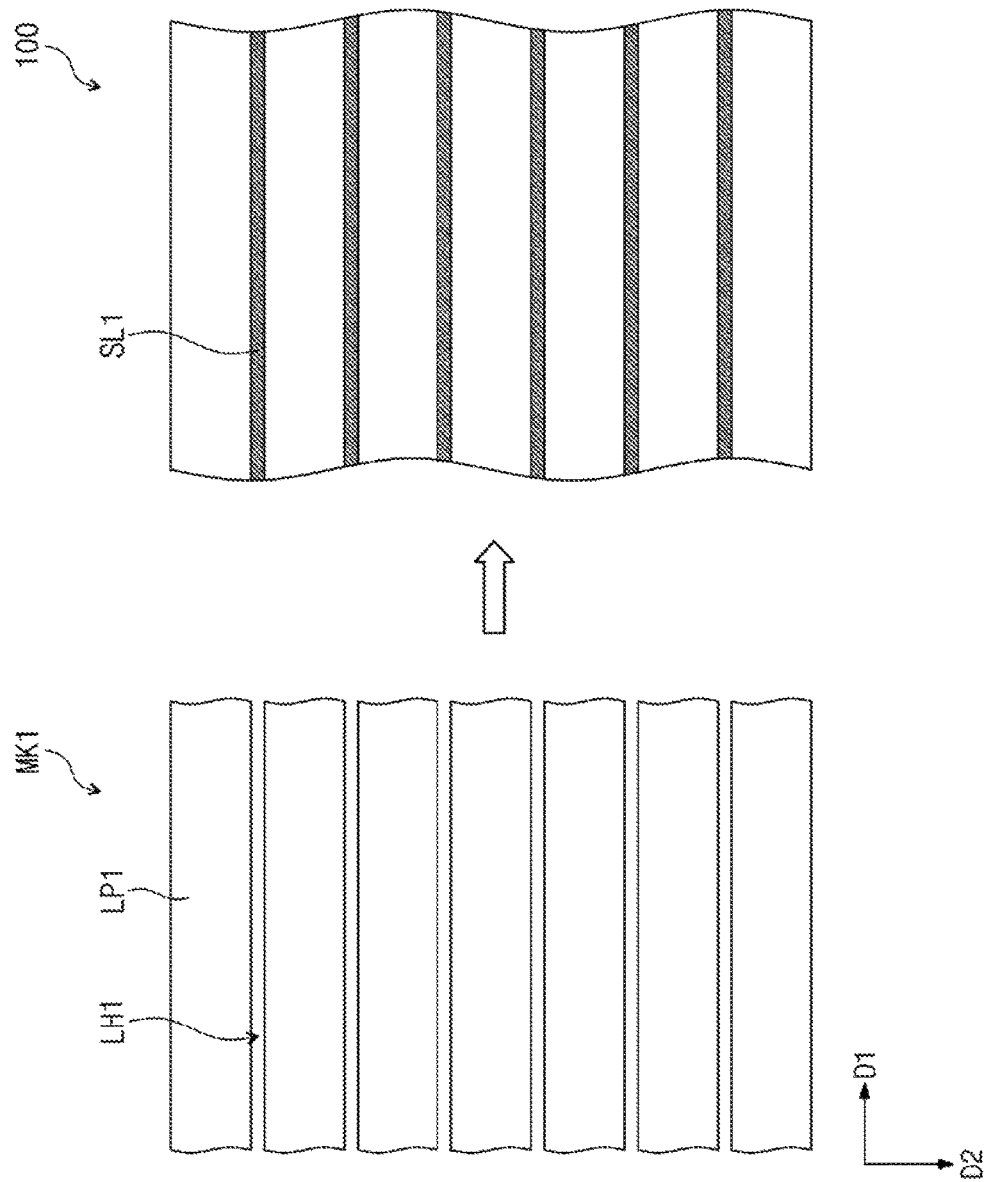

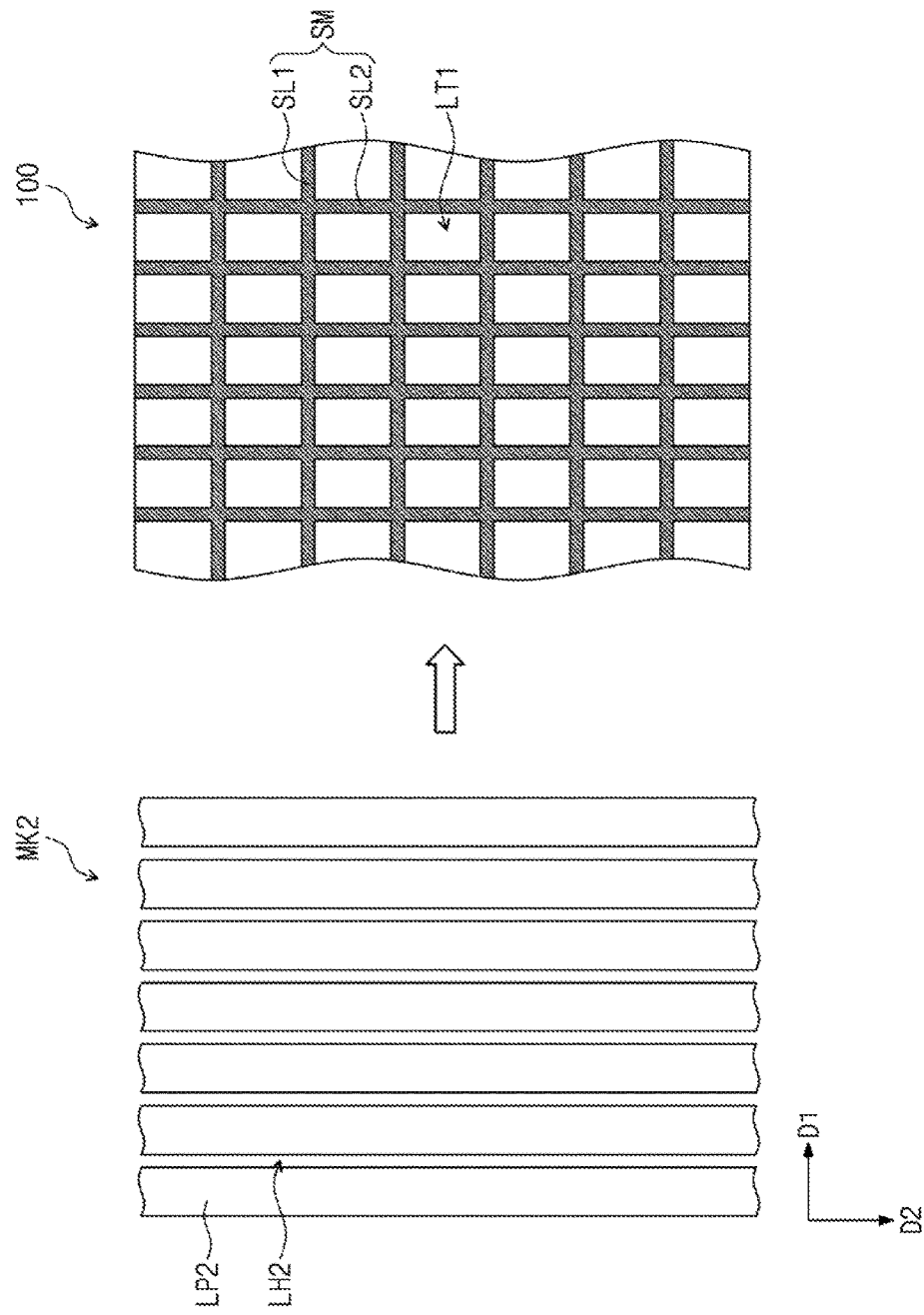

TRANSPARENT DISPLAY DEVICE INCLUDING LIGHT-PASSING SEALING MEMBER

CROSS-REFERENCE TO RELATED APPLICATIONS

This U.S. non-provisional patent application claims priority under 35 U.S.C. § 119 to Korean Patent Application No. 10-2016-0086299, filed on Jul. 7, 2016, in the Korean Intellectual Property Office, the entire contents of which are hereby incorporated by reference.

TECHNICAL FIELD

The present disclosure relates to a display device, and in particular, to a transparent display device.

DISCUSSION OF THE RELATED ART

Transparent display devices having a transparent display area/region are being developed to meet various consumers' demands. The transparent display device generally includes a display panel having transparent areas/regions, each of which is adjacent to each of the pixels of the display device. The transparent areas/regions allow light to pass therethrough. Thus, the user may simultaneously see an image to be displayed through the pixels of the display panel, and objects which are located behind the display panel.

SUMMARY

A transparent display device includes a display substrate having a display region and a sealing region surrounding the display region. The display region includes a plurality of pixel regions, each of which includes a light-emitting region and a transparent region. An opposite substrate faces the display substrate. A sealing member is interposed between the display substrate and the opposite substrate. The sealing member overlaps the sealing region. The sealing member bonds the display substrate to the opposite substrate and includes a plurality of first light openings defined therein.

A transparent display device includes a first substrate and a second substrate. A sealing member seals the first substrate to the second substrate. A plurality of pixels is disposed on the first substrate. Each of the plurality of pixels includes a light-emitting region configured to generate an image and a light-transmitting region configured to pass external light therethrough. The sealing member is configured to transmit light therethrough.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIGS. 11A and 11B are diagrams illustrating a method of forming the sealing member of FIG. 5 on a display substrate, according to exemplary embodiments of the present inventive concept.

DETAILED DESCRIPTION

Figure 1:
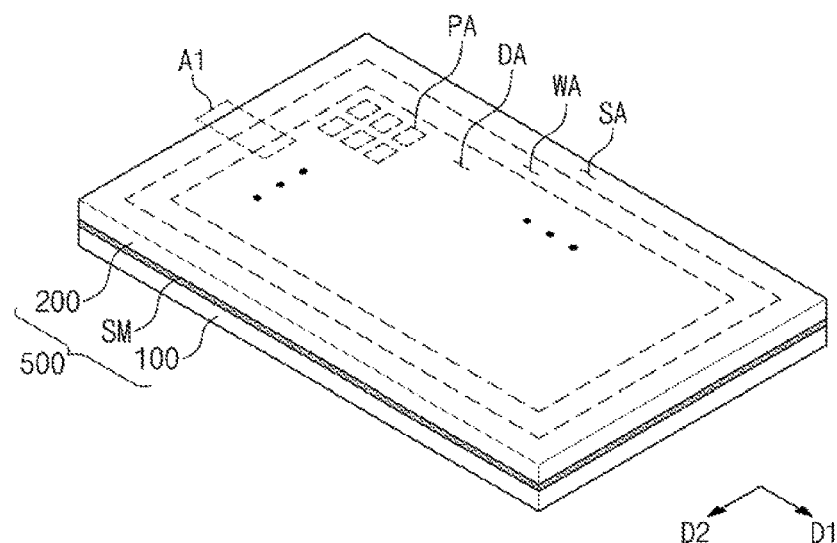
FIG. 1 is a perspective view of a transparent display device according to exemplary embodiments of the present inventive concept.

The figures are intended to illustrate the general characteristics of methods, structure and/or materials utilized in certain exemplary embodiments of the present inventive concept and to supplement the written description provided below. These drawings are not necessarily drawn to scale. For example, the relative thicknesses and positioning of molecules, layers, regions and/or structural elements may be reduced or exaggerated for clarity. The use of similar or identical reference numbers in the various drawings may indicate the presence of a similar or identical element or feature.

Exemplary embodiments of the present inventive concepts will now be described more fully with reference to the accompanying drawings, in which example embodiments are shown. Exemplary embodiments of the present inventive concepts may, however, be embodied in many different forms. In the drawings, the thicknesses of layers and regions may be exaggerated for clarity. Like reference numerals in the drawings may denote like elements throughout the application.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

Figure 2:
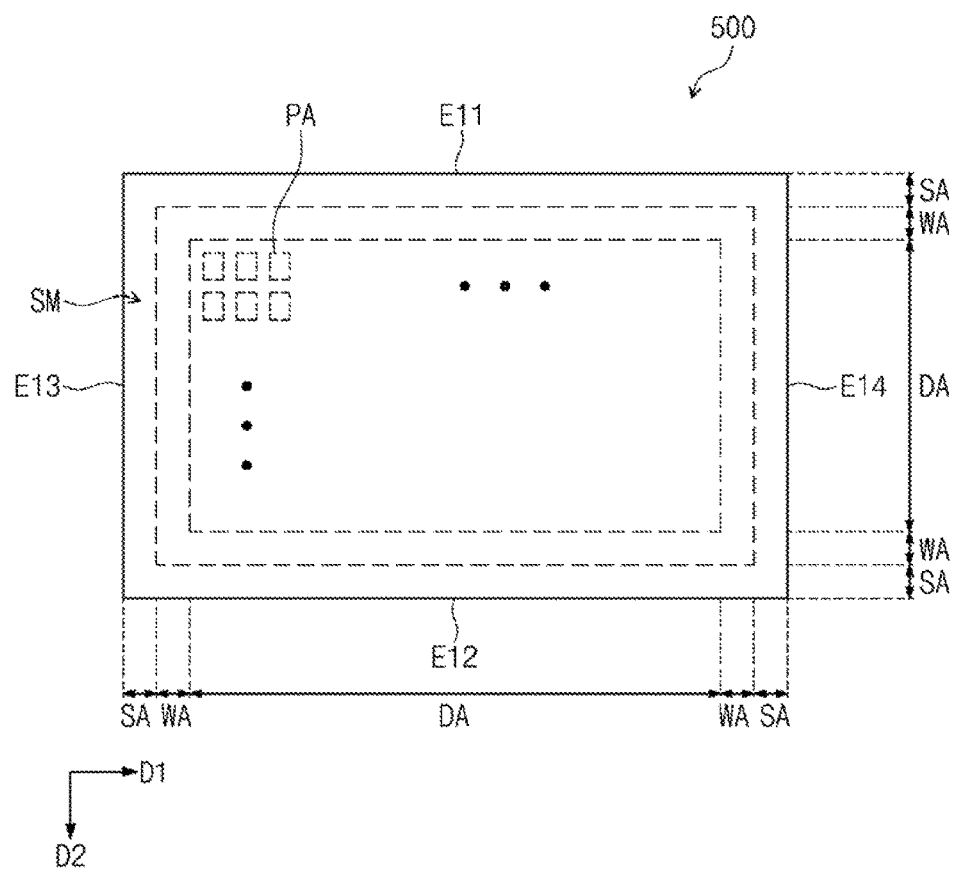
FIG. 2 is a plan view of the transparent display device of FIG. 1.

FIG. 1 is a perspective view of a transparent display device according to exemplary embodiments of the present inventive concept, and FIG. 2 is a plan view of the transparent display device of FIG. 1.

Referring to FIGS. 1 and 2, a transparent display device 500 may include a display substrate 100, an opposite substrate 200, and a sealing member SM. The display substrate 100 and the opposite substrate 200 may be disposed to face each other, and the sealing member SM may be interposed between the display substrate 100 and the opposite substrate 200 and may be used to bond the display substrate 100 to the opposite substrate 200.

Between the display substrate 100 and the opposite substrates 200, the sealing member SM may extend along a border of each of the display substrate 100 and the opposite substrate 200. In some exemplary embodiments of the present inventive concept, when viewed in a plan view, the transparent display device 500 may have first and second long sides E11 and E12, which are primarily extended in a first direction D1, and first and second short sides E13 and E14, which are primarily extended in a second direction D2 substantially perpendicular to the first direction D1. The sealing member SM may be disposed along the first and second long sides E1 and E12 and the first and second short sides E13 and E14, thereby having a closed loop shape.

In some exemplary embodiments of the present inventive concept, a composition material of the sealing member SM may include a frit. For example, when the sealing member SM is not yet cured, the sealing member SM may be disposed in the form of glass powder, and the sealing member SM in the transparent display device 500 may have a solid shape, which is formed by melting and curing the glass powder.

In some exemplary embodiments of the present inventive concept, a display area/region DA, a sealing area/region SA, and a wiring area/region WA may be defined in the display substrate 100. In the transparent display device 500, the display area/region DA may display an image and may include a plurality of pixel areas/regions PA arranged therein. Each of the pixel areas/regions PA may include a light-emitting area/region EA and a transparent area/region TA. Pixels PX may be disposed in the pixel areas/regions PA. Elements constituting each of the pixels PX may be disposed in the light-emitting area/region EA.

The sealing area/region SA may be disposed so as to enclose the display area/region DA, and the sealing member SM may be disposed in the sealing area/region SA. The wiring area/region WA may be defined between the display area/region DA and the sealing area/region SA, and a plurality of wires (e.g., wire portions WP of FIG. 4) may be disposed in the wiring area/region WA.

Figure 3:
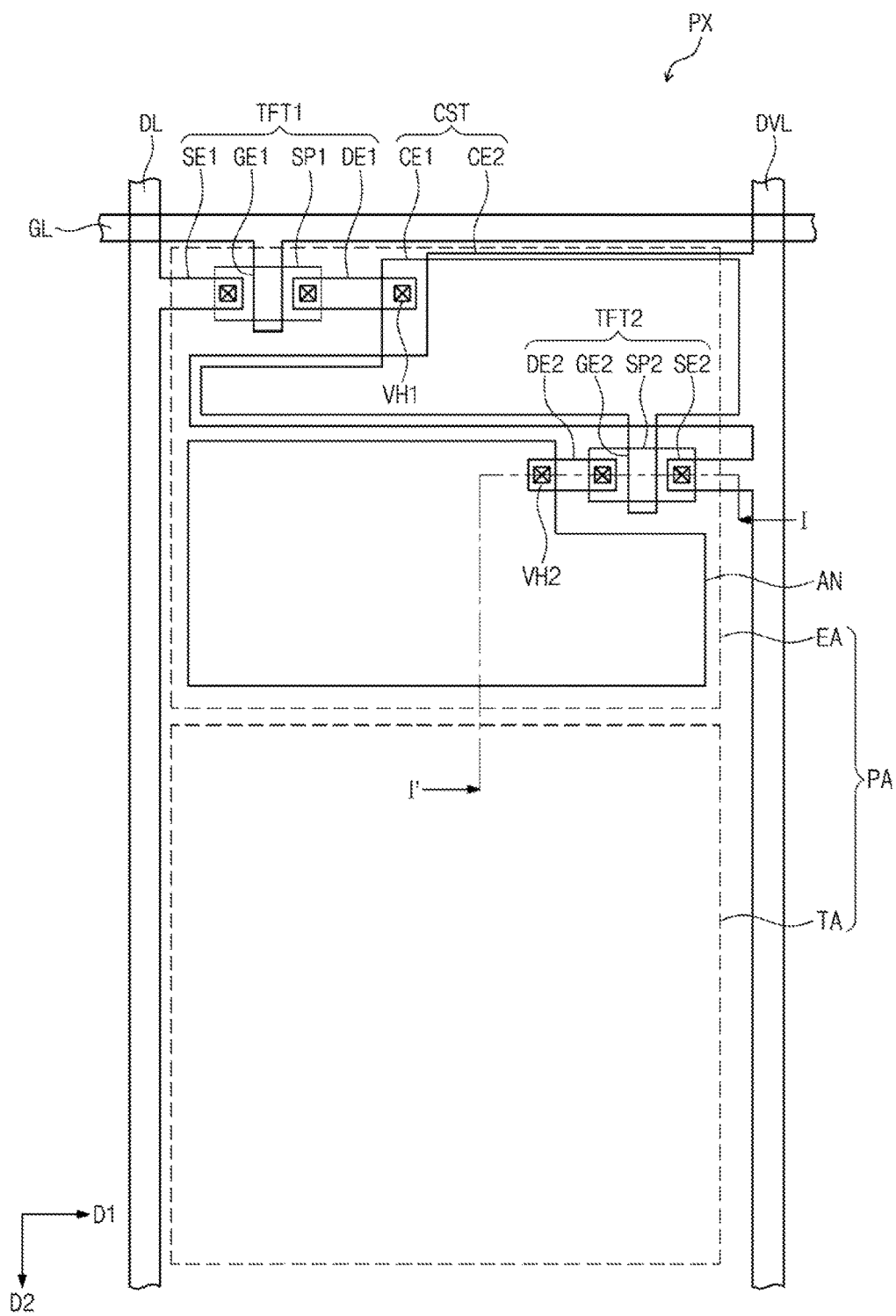
FIG. 3 is an enlarged plan view illustrating one of pixels disposed in a display area/region of the transparent display device of FIG. 1.
Figure 4:
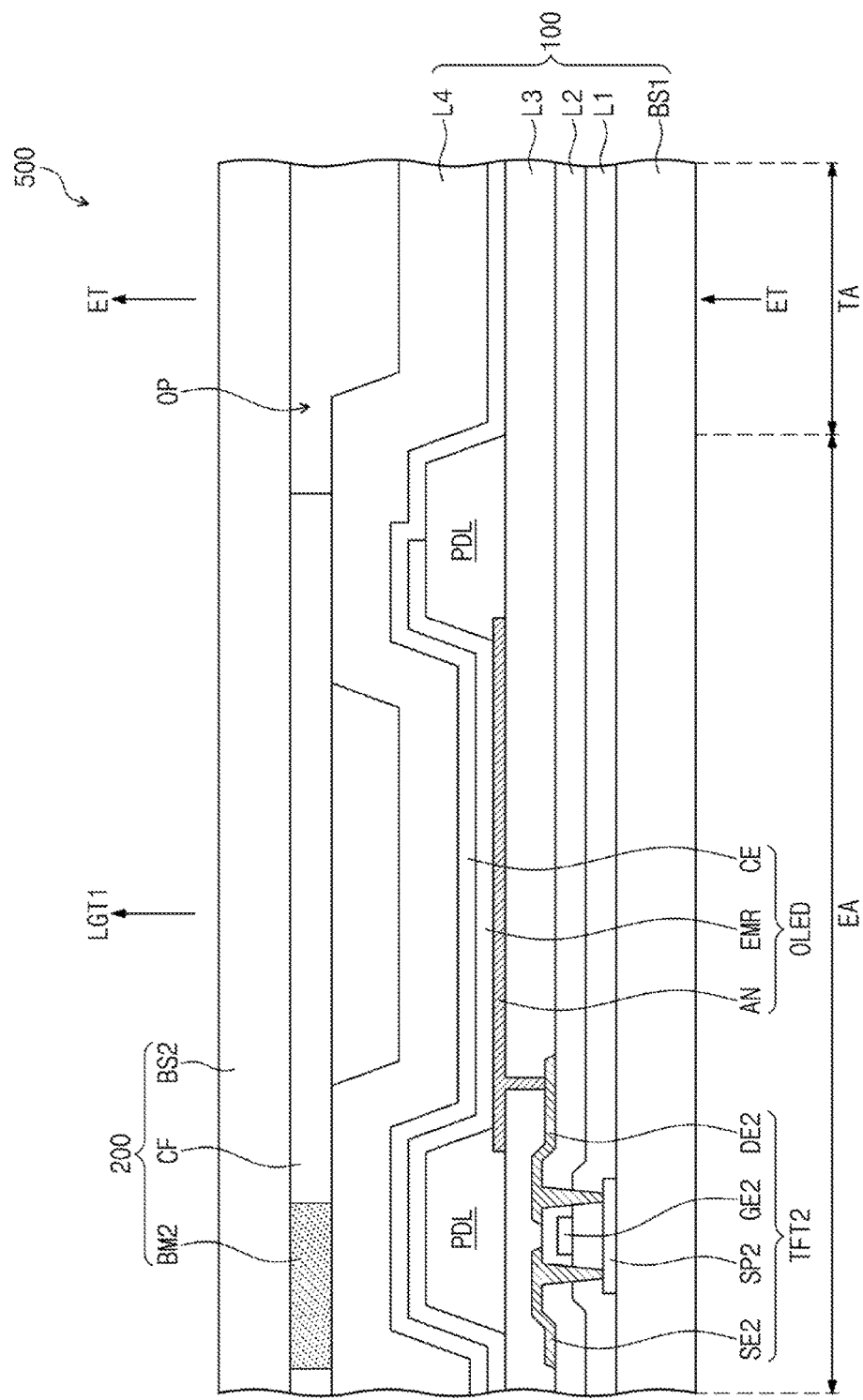
FIG. 4 is a sectional view taken along line I-I' of FIG. 3.

FIG. 3 is an enlarged plan view illustrating one of pixels disposed in a display area/region of the transparent display device of FIG. 1, and FIG. 4 is a sectional view taken along line I-I' of FIG. 3. The transparent display device 500 may include a plurality of pixels PX disposed in the display area/region DA of FIG. 1, but only one of the plurality of pixels PX is exemplarily illustrated in FIGS. 3 and 4.

Referring to FIGS. 3 and 4, the pixel area/region PA may include the light-emitting area/region EA and the transparent area/region TA. A pixel PX may be disposed in the light-emitting area/region EA of the display substrate 100, and the transparent area/region TA may be defined to be adjacent to the light-emitting area/region EA.

In some exemplary embodiments of the present inventive concept, the pixel PX may be configured to include a gate line GL, a data line DL, a power signal line DVL, a switching transistor TFT1, a driving transistor TFT2, a storage capacitor CST, and an organic light emitting device OLED.

The gate line GL may be disposed on a first base substrate BS1 and may transmit a gate signal, and the data line DL, which is electrically disconnected from the gate line GL, may be disposed on the first base substrate BS1 and may transmit a data signal. In some exemplary embodiments of the present inventive concept, the gate line GL may extend in the first direction D1, and the data line DL may extend in the second direction D2.

The switching transistor TFT1 may be electrically connected to the gate line GL and the data line DL. The switching transistor TFT1 may receive the gate signal through the gate line GL and receive the data signal through the data line DL.

The switching transistor TFT1 may include a first semiconductor pattern SP1, a first gate electrode GE1, a first source electrode SE1, and a first drain electrode DE1.

The first semiconductor pattern SP1 may be formed of or may otherwise include a semiconductor material. In some exemplary embodiments of the present inventive concept, the first semiconductor pattern SP1 may be formed of or may otherwise include poly silicon. However, the material of the first semiconductor pattern SP1 is not limited to poly silicon. For example, in certain exemplary embodiments of the present inventive concept, the first semiconductor pattern SP1 may be formed of or may otherwise include at least one of oxide semiconductor materials (e.g., IGZO, ZnO, $SnO_2$, $In_2O_3$, $Zn_2SnO_4$, $Ge_2O_3$, and $HfO_2$). In some exemplary embodiments of the present inventive concept, the first semiconductor pattern SP1 may be formed of or may otherwise include at least one of compound semiconductor materials (e.g., GaAs, GaP, and InP), and in some exemplary embodiments of the present inventive concept, the first semiconductor pattern SP1 may be formed of or may otherwise include amorphous silicon.

The first gate electrode GE1 may be connected to the gate line GL and may overlap the first semiconductor pattern SP1. The first source electrode SE1 may be connected to the data line DL and may be disposed so as to be in contact with a source region of the first semiconductor pattern SP1, and the first drain electrode DE1 may be disposed in contact with a drain region of the first semiconductor pattern SP1 and may thus be connected to the storage capacitor CST.

The storage capacitor CST may include a first storage electrode CE1 and a second storage electrode CE2, which may overlap each other when viewed in a plan view. The first storage electrode CE1 may be connected to the first drain electrode DE1 through a first via hole VH1. Also, at least one of a gate insulating layer L1 and an intermediate insulating layer L2 may be interposed between the first and second storage electrodes CE1 and CE2.

The first storage electrode CE1 may be connected to the first drain electrode DE1, and the second storage electrode CE2 may be connected to the power signal line DVL. In the case that the switching transistor TFT1 and the power signal line DVL receive the data and power signals respectively, the storage capacitor CST may store electric charges whose amount is determined by a difference in voltage between the data and power signals, and the stored electric charges may be transferred to the driving transistor TFT2, when the switching transistor TFT1 is turned-off.

The driving transistor TFT2 may be electrically connected to the switching transistor TFT1, the power signal line DVL, and the organic light emitting device OLED and may control a switching operation on the power signal, which is provided from the power signal line DVL to the organic light emitting device OLED.

The driving transistor TFT2 may include a second semiconductor pattern SP2, a second gate electrode GE2, a second source electrode SE2, and a second drain electrode DE2. The second gate electrode GE2 may be connected to the first drain electrode DE1 through the first storage electrode CE1, and the second source electrode SE2 may be connected to the power signal line DVL. The second drain electrode DE2 may be connected to the organic light emitting device OLED through a second via hole VH2 which is formed in a cover insulating layer L3.

The gate insulating layer L1 may be disposed to cover the second semiconductor pattern SP2, and the intermediate insulating layer L2 may be disposed on the gate insulating layer L1 to cover the second gate electrode GE2. The cover insulating layer L3 may be disposed on the intermediate insulating layer L2 to cover the second source electrode SE2 and the second drain electrode DE2.

The organic light emitting device OLED may be configured to emit light in response to the power signal transferred through the driving transistor TFT2. In some exemplary embodiments of the present inventive concept, the organic light emitting device OLED may include an anode AN, hole control layer HTR, an organic light emitting region/layer EMR, an electron control layer ETR, and a cathode CE.

The anode AN may be disposed on the cover insulating layer L3 and may be connected to the second drain electrode DE2 through the second via hole VH2, which is formed to pass through the cover insulating layer L3.

In some exemplary embodiments of the present inventive concept, the anode AN may be a reflective electrode, and in this case, the anode AN may be a metal layer that is formed of at least one of metallic materials (e.g., Ag, Mg, Al, Pt, Pd, Au, Ni, Nd, Ir, and Cr). In some exemplary embodiments of the present inventive concept, the anode AN may further include a metal oxide layer disposed on the metal layer. For example, the anode AN may be disposed having a double-layer structure (e.g., including ITO/Mg or ITO/MgF layers) or a multi-layer structure (e.g., including ITO/Ag/ITO layers).

A pixel definition layer PDL may be disposed on the anode AN. The pixel definition layer PDL may be disposed having an opening, which is formed at a position corresponding to the anode AN, and the organic light emitting region/layer EMR may be in contact with the anode AN through the opening of the pixel definition layer PDL.

In some exemplary embodiments of the present inventive concept, the hole control layer HTR may include a hole injection layer and a hole transport layer, and in some exemplary embodiments of the present inventive concept, the hole control layer HTR may include at least one of a hole buffer layer or an electron stop layer.

The hole injection layer may include a hole injection material, and in some exemplary embodiments of the present inventive concept, the hole injection material may include at least one of phthalocyanine compounds (e.g., copper phthalocyanine), DNTPD (N,N'-diphenyl-N,N'-bis-[4-(phenyl-m-tolyl-amino)-phenyl]-biphenyl-4,4'-diamine), m-MTDATA(4,4',4"-tris(3-methylphenylphenylamino) triphenylamine), TDATA(4,4'4"-Tris(N,N-diphenylamino)triphenylamine), 2-TNATA(4,4',4"-tris {N,-(2-naphthyl)-N-phenylamino}-triphenylamine), PEDOT/PSS(Poly(3,4-ethylenedioxythiophene)/Poly(4-styrenesulfonate), PANI/DBSA(Polyaniline/Dodecylbenzenesulfonic acid), PANI/CSA(Polyaniline/Camphor sulfonicacid), or PANI/PSS ((Polyaniline)/Poly(4-styrenesulfonate). However, the material of the hole injection material is not limited to the above examples.

The hole transport layer may include a hole transporting material. The hole transporting material may include at least one of carbazole derivatives (e.g., N-phenylcarbazole or polyvinylcarbazole), fluorine derivatives, TPD(N,N'-bis(3-methylphenyl)-N,N'-diphenyl-[1,1-biphenyl]-4,4'-diamine), triphenylamine derivatives (e.g., TCTA(4,4',4"'-tris(N-carbazolyl)triphenylamine)), NPB(N,N'-di(1-naphthyl)-N,N'-diphenylbenzidine), or TAPC(4,4'-Cyclohexylidene bis[N,N-bis(4-methylphenyl)benzenamine]). However, the material of the hole transport layer is not limited to the above examples.

The organic light emitting region/layer EMR may be disposed on the hole control layer HTR. In some exemplary embodiments of the present inventive concept, the organic light emitting region/layer EMR may be configured to emit a white light, and a color filter CF may be used to convert the white light to a colored light. In some exemplary embodiments of the present inventive concept, the organic light emitting region/layer EMR may be configured to emit a colored light (e.g., blue, green, and/or red light).

In some exemplary embodiments of the present inventive concept, the electron control layer ETR may be disposed including an electron transport layer and an electron injection layer that are stacked, and in some exemplary embodiments of the present inventive concept, the electron injection layer may be omitted from the electron control layer ETR.

The electron transport layer may include an electron transporting material, and in some exemplary embodiments of the present inventive concept, the electron transporting material may include at least one of Alq3(Tris(8-hydroxyquinolinato)aluminum), TPBi(1,3,5-Tri(1-phenyl-1H-benzo[d]imidazol-2-yl)phenyl), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato) aluminm), Bebq2(berylliumbis(benzoquinolin-10-olate), ADN(9,10-di(naphthalene-2-yl)anthracene), or mixtures thereof. However, the material of the electron transporting material is not limited to the above examples.

The electron injection layer may include an electron injection material, and in some exemplary embodiments of the present inventive concept, the electron injection material may include at least one of lanthanide metals (e.g., LiF, LiQ (Lithium quinolate), $Li_2O$, BaO, NaCl, CsF, and Yb) or halogenated metals (e.g., RbCl and RbI). However, the material of the electron injection material is not limited to the above examples. For example, in some exemplary embodiments of the present inventive concept, the electron injection layer may include a mixture of an electron transporting material and an insulating organo-metal salt, where the organo-metal salt may be a material whose energy band gap is larger than about 4 eV. As an example, the organo-metal salt may include metal acetate, metal benzoate, metal acetoacetate, metal acetylacetonate, or metal stearate.

The cathode CE may be disposed on the organic light emitting region/layer EMR. In some exemplary embodiments of the present inventive concept, the cathode CE may be configured to be semitransparent or transparent.

In the case where the cathode CE is semitransparent, the cathode CE may be formed of or may otherwise include at least one of Ag, Mg, Cu, Al, Pt, Pd, Au, Ni, Nd. Ir, Cr, Li, Ca, LiF/Ca, LiF/Al, Mo, Ti, compounds or mixtures thereof (e.g., a mixture of Ag and Mg). In the case where the cathode CE has a thickness of several tens to several hundreds of angstroms, the cathode CE may be semitransparent.

In the case where the cathode CE is transparent, the cathode CE may be formed of or include a transparent conductive oxide (TCO). For example, the cathode CE may be formed of or may otherwise include tungsten oxide ($WxOx$), titanium oxide ($TiO_2$), indium tin oxide (ITO), indium zinc oxide (IZO), zinc oxide (ZnO), indium tin zinc oxide (ITZO), or magnesium oxide (MgO).

A sealing film L4 may be disposed on the cathode CE and may hermetically seal the organic light emitting device OLED. The use of the sealing film L4 may make it possible to prevent gas or moisture from being infiltrated into the organic light emitting device OLED. Here, the sealing film L4 may include a plurality of inorganic and organic layers alternately stacked on one another. In some exemplary embodiments of the present inventive concept, a single insulating layer, instead of the sealing film LA, may be disposed covering the cathode CE.

The opposite substrate 200 may include a second base substrate BS2, a color filter CF, a first light-blocking matrix/pattern (e.g., BM1 of FIG. 6), and a second light-blocking matrix/pattern BM2. The second base substrate BS2 may be disposed facing the first base substrate BS1, and the color filter CF and the second light-blocking matrix/pattern BM2 may be disposed on the second base substrate BS2. The structure of the first light-blocking matrix/pattern BM1 will be described in more detail with reference to FIGS. 5 and 6.

The color filter CF may be disposed in the light-emitting area/region EA and may overlap the anode AN and may convert a white light, which is emitted from the organic light emitting region/layer EMR, to a colored light LGT1. For example, as a result of the use of the color filter CF, the colored light LGT1 may be emitted or output from the light-emitting area/region EA.

A portion of the color filter CF corresponding to the transparent area/region TA may be removed to define an opening OP in the color filter CF. Accordingly, in the case where an external light ET is incident into the display substrate 100 through a rear surface of the transparent display device 500, the external light ET may pass through the display substrate 100 and may pass through to the outside of the transparent display device 500 through the opening OP of the opposite substrate 200. As a result, the external light ET may be emitted or output from the transparent area/region TA.

As for the afore-described propagation paths of the colored and external light LGT1 and ET, the colored light LGT1 output from the light-emitting area/region EA may display an image on the transparent display device 500, and the external light ET output from the transparent area/region TA may allow a user to see an object or image though the transparent display device 500.

In some exemplary embodiments of the present inventive concept, to increase a transmission ratio of the external light ET passing through the transparent area/region TA, at least one of the cathode CE, the sealing film L4, the cover insulating layer L3, the intermediate insulating layer L2, and the gate insulating layer L1 may be partially opened at a position corresponding to the transparent area/region TA.

The second light-blocking matrix/pattern BM2 may be disposed to overlap a plurality of wires (e.g., the gate line GL, the data line DL, and the power signal line DVL) and the driving transistor TFT2 and may prevent light from passing therethrough. In addition, to increase the transmission ratio of the external light ET passing through the transparent area/region TA as described above, the second light-blocking matrix/pattern BM2 might not be disposed in the transparent area/region TA.

Figure 5:
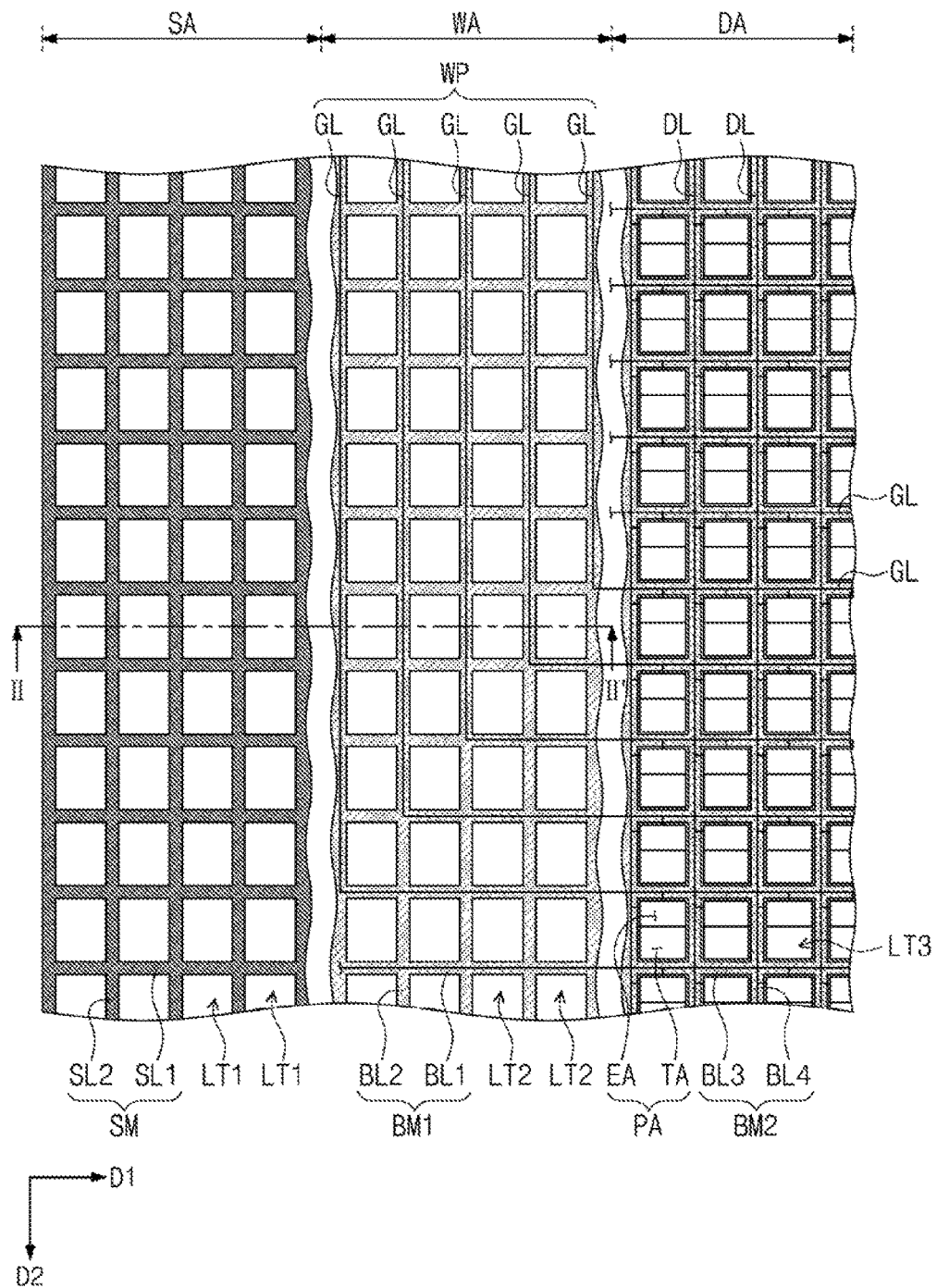
FIG. 5 is an enlarged plan view illustrating a first area/region of the transparent display device of FIG. 1.
Figure 6:
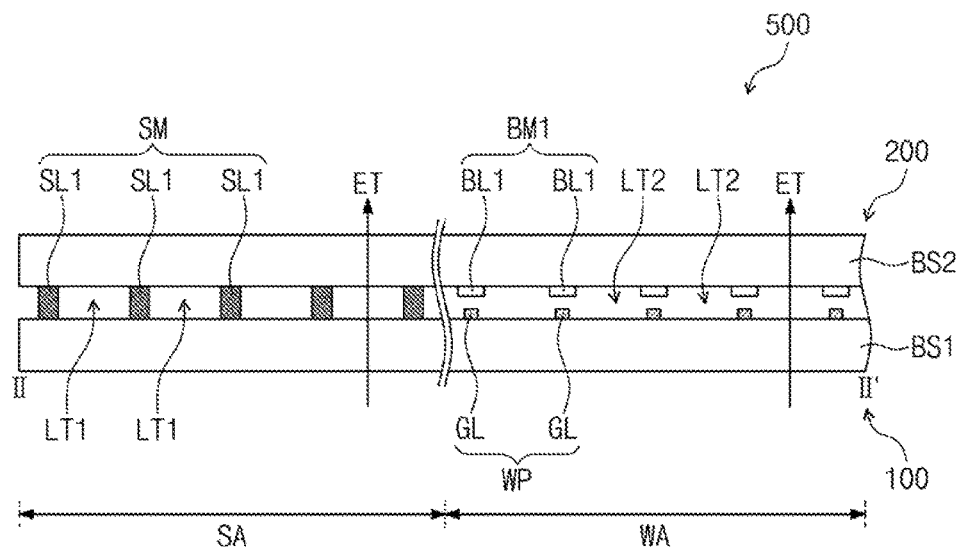
FIG. 6 is a sectional view taken along line II-II' of FIG. 5.

FIG. 5 is an enlarged plan view illustrating a first area/region A1 of the transparent display device 500 of FIG. 1, and FIG. 6 is a sectional view taken along line II-II' of FIG. 5.

Referring to FIGS. 5 and 6, the sealing member SM may be disposed along the sealing area/region SA and between the first and second base substrates BS1 and BS2. The sealing member SM may bond the display substrate 100 and the opposite substrate 200 to each other.

In some exemplary embodiments of the present inventive concept, the sealing member SM may be a mesh. For example, the sealing member SM may include first sealing lines SL1, each of which is disposed to extend in the first direction D1, and second sealing lines SL2, each of which is disposed to extend in the second direction D2 or to otherwise cross the first direction D1. The first sealing lines SL1 may cross the second sealing lines SL2. Furthermore, the first sealing lines SL1 may be spaced apart from each other by a first predetermined space, and the second sealing lines SL2 may be spaced apart from each other by a second predetermined space, which may be equal to or different from the first predetermined space.

According to the afore-described structures of the first and second sealing lines SL and SL2, a plurality of first light openings LT1 may be defined in the sealing member SM. For example, each of the first light openings LT1 may be defined by an adjacent pair of the first sealing lines SL1 and an adjacent pair of the second sealing lines SL2.

In the case where the sealing member SM has a width direction D1 and length direction D2, the first light openings LT1 in the sealing area/region SA may be arranged in the first and second directions D1 and D2 or in a matrix shape.

According to some exemplary embodiments of the present inventive concept, a method of forming the sealing member SM may include forming a preliminary sealing member to entirely cover the sealing area/region SA, forming a photosensitive film on the preliminary sealing member, and patterning the preliminary sealing member using a photolithography process to form the sealing member SM with the mesh structure. The photolithography process may be performed using a photomask, a portion of which has substantially the same mesh shape as that of the sealing member SM.

According to some exemplary embodiments of the present inventive concept, a method of forming the sealing member SM may include forming the sealing member SM including the first and second sealing lines SL1 and SL2 on the sealing area/region SA using a print mask. Here, the print mask may have an opening with a shape corresponds to that of the first and second sealing lines SL1 and SL2.

According to exemplary embodiments of the present inventive concept, a method of forming the sealing member SM may include forming the first sealing lines SL in the sealing area/region SA using a first print mask and forming the second sealing lines SL2 in the sealing area/region SA using a second print mask. Here, the first print mask may have an opening whose shape corresponds to that of the first sealing lines SL1, and the second print mask may have an opening whose shape corresponds to that of the second sealing lines SL2.

According to the afore-described structures of the first and second sealing lines SL1 and SL2, the plurality of first light openings LT1 may be defined in the sealing member SM. In this case, the plurality of first light openings LT1 may allow the external light ET to pass through the transparent display device 500, similar to the opening OP of the color filter CF described with reference to FIG. 4. This may make it possible to increase optical transmittance of a portion of the transparent display device 500 corresponding to the sealing area/region SA and thereby to increase the resulting transparency of the transparent display device 500.

If the plurality of first light openings LT1 are not defined in the sealing member SM, the sealing member SM may lead to an increase in absorptivity of the external light ET and a reduction in transparency of the transparent display device 500 at the sealing area/region SA, and thus, the presence of the sealing member SM may be more clearly perceived by a user. However, according to exemplary embodiments of the present inventive concept, since the plurality of first light openings LT1 are defined in the sealing member SM, it is possible to increase optical transmittance of the sealing member SM and thus, this may make it difficult for a user to perceive the presence of the sealing member SM. For example, it is possible to increase transparency of the transparent display device 500 at the sealing area/region SA.

A wire portion WP may be disposed on the first base substrate BS1 and along the wiring area/region WA. In some exemplary embodiments of the present inventive concept, the wire portion WP may include a plurality of gate lines GL. As shown in FIG. 3, each of the plurality of gate lines GL may be extended from the wiring area/region WA toward the display area/region DA and may be electrically connected to the switching transistor TFT1. However, according to some exemplary embodiments of the present inventive concept, lines to be disposed in the wire portion WP are not limited to a specific type of lines, and the wire portion WP may be configured to further include other types of lines, which have been described to be disposed on the wiring area/region WA, in addition to the gate lines GL.

The first light-blocking matrix/pattern BM1 may be disposed on the second base substrate BS2, and in the wiring area/region WA, the first light-blocking matrix/pattern BM1 may overlap the wire portion WP. Accordingly, the first light-blocking matrix/pattern BM1 may contribute to reduce an amount of external light to be reflected by the wire portion WP.

According to exemplary embodiments of the present inventive concept, the first light-blocking matrix/pattern BM1 may be configured to have the same mesh structure as that of the sealing member SM. For example, the first light-blocking matrix/pattern BM1 may include first light-blocking lines BL1, each of which extends in the first direction D1, and second light-blocking lines BL2, each of which extends in the second direction D2.

The first light-blocking lines BL1 may be disposed to cross the second light-blocking lines BL2. The first light-blocking lines BL1 may be spaced apart from each other by a first predetermined space, and the second light-blocking lines BL2 may be spaced apart from each other by a second predetermined space that may be equal to or different from.

According to the afore-described structure of the first light-blocking matrix/pattern BM1, a plurality of second light openings LT2 may be defined in the first light-blocking matrix/pattern BM1. For example, each of the second light openings LT2 may be defined by an adjacent pair of the first light-blocking lines BL1 and an adjacent pair of the second light-blocking lines BL2.

Here, the plurality of second light openings LT2 in the wiring area/region WA may be arranged in the first and second directions D1 and D2 or in a matrix shape.

In the case where, as described above, the plurality of second light openings LT2 are defined in the first light-blocking matrix/pattern BM1, the plurality of second light openings LT2 may increase optical transmittance of the external light ET passing through the transparent display device 500, similar to the first light openings LT1 in the sealing member SM. This may make it difficult for a user to perceive the presence of the first light-blocking matrix/pattern BM1, and thus, it is possible to increase optical transmittance of a portion of the transparent display device 500 corresponding to the wiring area/region WA and, consequently, the resulting transparency of the transparent display device 500.

According to exemplary embodiments of the present inventive concept, an area of each of the first light openings LT1 may be substantially the same as that of each of the second light openings LT2, and a shape of each of the first light openings LT1 may be substantially the same as that of each of the second light openings LT2. Thus, when the mesh structure of each of the sealing member SM and the first light-blocking matrix/pattern BM1 is perceived by a user, the user may recognize the mesh structure as a single object, regardless of whether the mesh structure perceived by the user is originated from the sealing area/region SA or the wiring area/region WA, and this may make it possible to reduce visibility of each of the first light-blocking matrix/pattern BM1 and the sealing member SM.

Second light-blocking matrix/pattern BM2 may be disposed on the second base substrate BS2 and in the display area/region DA, the second light-blocking matrix/pattern BM2 may overlap the plurality of gate lines GL and the plurality of data lines DL. Thus, the second light-blocking matrix/pattern BM2 may contribute to reduce an amount of the external light to be reflected by the plurality of gate lines GL and the plurality of data lines DL.

Here, the second light-blocking matrix/pattern BM2 may have the same mesh structure as the sealing member SM and the first light-blocking matrix/pattern BM1. For example, the second light-blocking matrix/pattern BM2 may include third light-blocking lines BL3, each of which extends in the first direction D1, and fourth light-blocking lines BL4, each of which extends in the second direction D2.

Here, the third light-blocking lines BL3 may cross the fourth light-blocking lines BL4. Furthermore, the third light-blocking lines BL3 may be spaced apart from each other by a third predetermined space, and the fourth light-blocking lines BL4 may be spaced apart from each other by a fourth predetermined space that may either be different from or the same as the third predetermined space.

According to the afore-described structure of the second light-blocking matrix/pattern BM2, a plurality of third light openings LT3 may be defined in the second light-blocking matrix/pattern BM2. Each of the third light openings LT3 may be defined by an adjacent pair of the third light-blocking lines BL3 and an adjacent pair of the fourth light-blocking lines BL4.

In addition, the pixel area/region PA described with reference to FIG. 3 (e.g., the light-emitting area/region EA and the transparent area/region TA) may be defined in each of the third light openings LT3. An area and a shape of each of the third light openings LT3 may be substantially the same as those of the pixel area/region PA. When viewed in a plan view, the area of the pixel area/regions PA may be equal to that of the third light openings LT3.

Here, the third light openings LT3 in the display area/region DA may be arranged in the first and second directions D1 and D2 or in a matrix shape.

Here, the area of each of the third light openings LT3 may be substantially equal to that of each of the first light openings LT1 or each of the second light openings LT2, and the shape of each of the third light openings LT3 may be substantially the same as that of each of the first light openings LT1 or each of the second light openings LT2. Thus, when the mesh structure of each of the sealing member SM, the first light-blocking matrix/pattern BM1, and the second light-blocking matrix/pattern BM2 is perceived by a user, the user may recognize the mesh structure as a single object formed throughout the sealing area/region SA, the wiring area/region WA, and the display area/region DA, and this may make it possible to reduce the visibility of each of the sealing member SM, the first light-blocking matrix/pattern BM1, and the second light-blocking matrix/pattern BM2.

Figure 7:
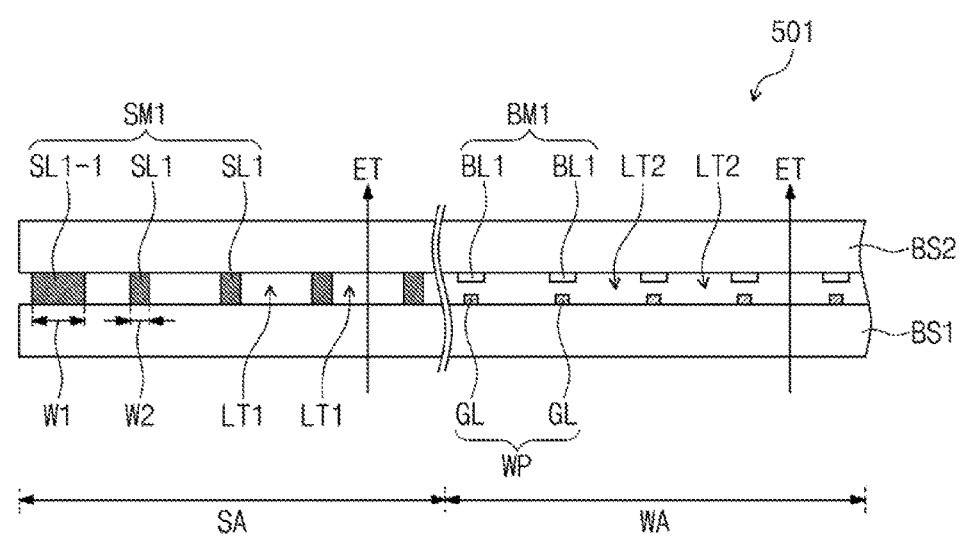
FIG. 7 is a sectional view illustrating cross-sections of sealing and wiring area/regions of a transparent display device, according to exemplary embodiments of the present inventive concept.

FIG. 7 is a sectional view illustrating cross-sections of sealing and wiring areas/regions SA and WA of a transparent display device 501, according to exemplary embodiments of the present inventive concept. In the following description of FIG. 7, a previously described element may be identified by a similar or identical reference number.

Referring to FIG. 7, the transparent display device 501 may include a sealing member SM1 which is disposed in the sealing area/region SA, and the sealing member SM1 may include an outermost sealing line SL1-1 and a plurality of sealing lines SL.

The outermost sealing line SL1-1 may be adjacent to the outermost area/region or the border of the display substrate 100, compared with the plurality of sealing lines SL. The outermost sealing line SL1-1 may have a first width W1, and each of the sealing lines SL1, may have a second width W2 smaller than the first width W1. For example, in the case where the second width W2 is about 40 μm, the first width W1 may range from about 60 μm to about 100 μm.

Since, as described above, the outermost sealing line SL1-1 in the sealing member SM1 is disposed at the outermost area/region, the outermost sealing line SL1-1 may be exposed to an external moisture and gas. However, since the outermost sealing line SL1-1 has a width larger than that of each of the sealing lines SL1, the outermost sealing line SL1-1 may more effectively prevent the moisture and the gas from passing therethrough, compared with each of the sealing lines SL1. Thus, even if the sealing member SM1 has the mesh structure, it is possible to prevent the moisture/gas prevention function of the sealing member SM1 from being deteriorated.

Figure 8:
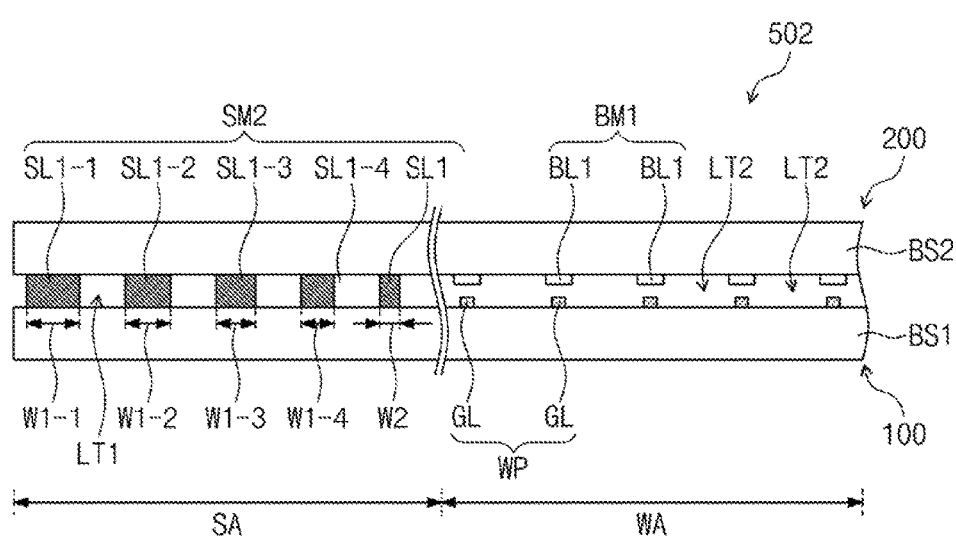
FIG. 8 is a sectional view illustrating cross-sections of sealing and wiring area/regions of a transparent display device, according to exemplary embodiments of the present inventive concept.

FIG. 8 is a sectional view illustrating cross-sections of sealing and wiring area/regions SA and WA of a transparent display device 502, according to exemplary embodiments of the present inventive concept. In the following description of FIG. 8, a previously described element may be identified by a similar or identical reference number.

Referring to FIG. 8, the transparent display device 502 may include a sealing member SM2 disposed in the sealing area/region SA, and the sealing member SM2 may include a plurality of sealing lines having at least two different widths. For example, as shown in FIG. 8, the sealing member SM2 may include first to fourth sealing lines SL1-1, SL1-2, SL1-3, and SL1-4, which are sequentially arranged in a direction from the outermost area/region of the display substrate 100 toward an inner area/region of the display substrate 100, in the order enumerated.

Here, the first sealing line SL1-1 may have a first width W1-1, the second sealing line SL1-2 may have a second width W1-2 smaller than the first width W1-1, the third sealing line SL1-3 may have a third width W1-3 smaller than the second width W1-2, and the fourth sealing line SL1-4 may have a fourth width W1-4 smaller than the third width W1-3. For example, the first width W1-1 may be about 100 μm, the second width W1-2 may be about 90 μm, the third width W1-3 may be about 80 μm, and the fourth width W1-4 may be about 70 μm. Also, a sealing line SL1, which are located to be adjacent to the display area/region DA, compared with the first to fourth sealing lines SL1-1, SL1-2, SL1-3, and SL1-4, may have a width W2 (e.g., about 40 μm) smaller than the fourth width W1-4.

In the structure of the sealing member SM2 illustrated in FIG. 8, the sealing member SM2 may be designed in such a way that each of the first to fourth sealing lines SL1-1, SL1-2, SL1-3, and SL1-4, which are adjacent to the border of the display substrate 100, has a width larger than that of each of the remaining sealing lines, and this may make it possible to strengthen a moisture/gas prevention function of the sealing member SM2. In addition, since the widths of the first to fourth sealing lines SL1-1, SL1-2, SL1-3, and SL1-4 decrease in a direction toward an internal region of the display substrate 100, a gradation effect may occur when the first to fourth sealing lines SL1-1, SL1-2, SL1-3, and SL1-4 are observed by a user.

Accordingly, each of the first to fourth sealing lines SL1-1, SL1-2, SL1-3, and SL1-4 may be prevented from being perceived to the same extent by a user, and the first to fourth sealing lines SL1-1, SL1-2, SL1-3, and SL1-4 may be recognized as a single object with the gradation effect. This may make it possible to increase a measure of transparency of the transparent display device 502 at the sealing area/region SA.

FIGS. 9A, 9B, 10A, and 10B are diagrams illustrating a method of forming the sealing member SM of FIG. 1 on the display substrate 100, according to exemplary embodiments of the present inventive concept.

Figure 9A:
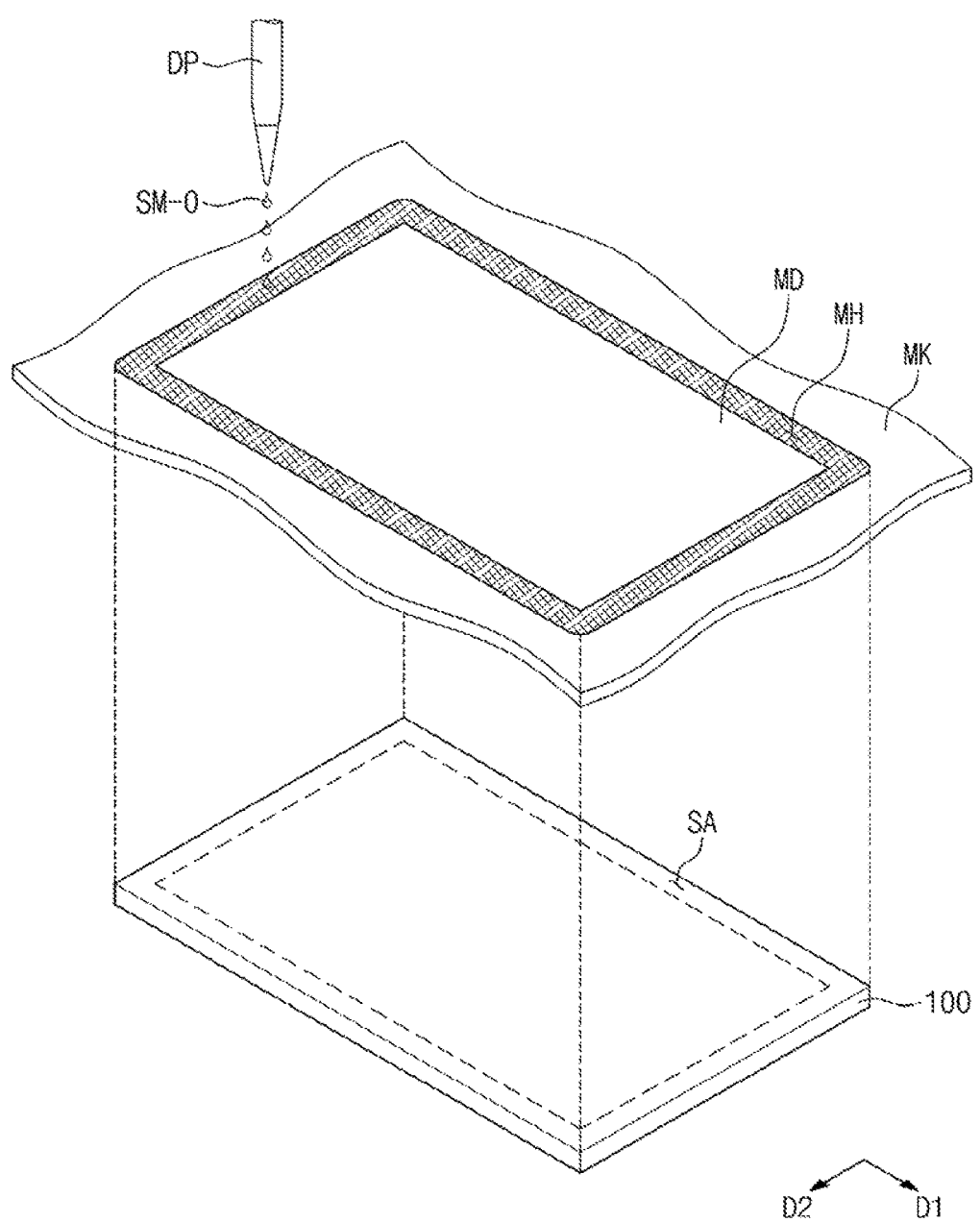
FIGS. 9A, 9B, 10A, and 10B are diagrams illustrating a method of forming the sealing member of FIG. 1 on a display substrate, according to exemplary embodiments of the present inventive concept.

Referring to FIG. 9A, a mask MK may be disposed over the display substrate 100. Here, the mask MK may form a patterned structure of the sealing member SM on the sealing area/region SA of the display substrate 100, as illustrated in FIG. 10B.

Here, the mask MK may be prepared to have a mask hole MH corresponding to the sealing area/region SA. Fine connection patterns LP may be formed in the mask hole MH to prevent the mask MK from being divided into a plurality of portions by the mask hole MH.

Figure 9B:
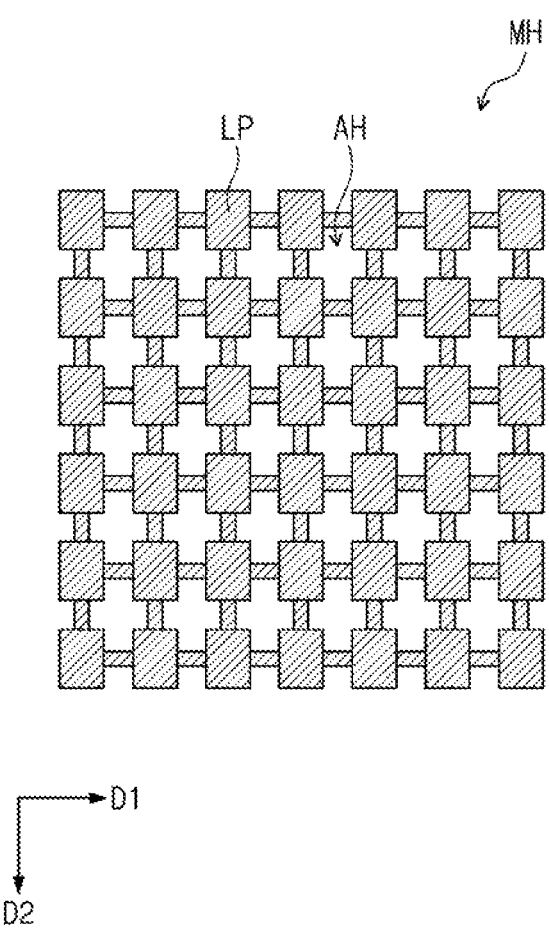

The fine connection patterns LP may be connected to each other in the first and second directions D1 and D2, thereby defining a plurality of auxiliary holes AH in the mask hole MH. According to a shape or arrangement of the fine connection patterns LP, each of the auxiliary holes AH may have various shapes (e.g., a cross shape as shown in FIG. 9B), and moreover, the auxiliary holes AH may be arranged to be spaced apart from each other in the first and second directions D1 and D2.

Figure 10A:
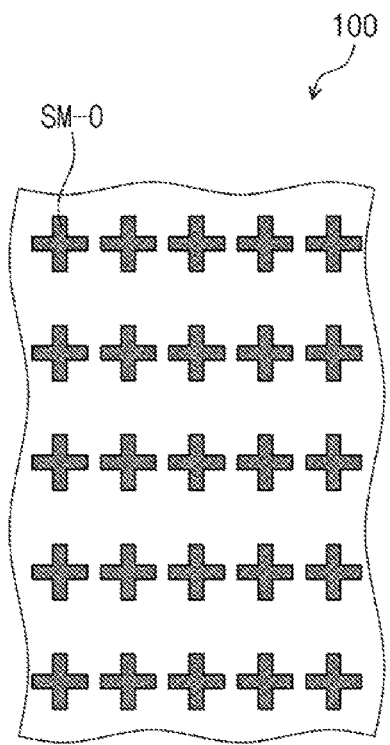
Figure 10B:
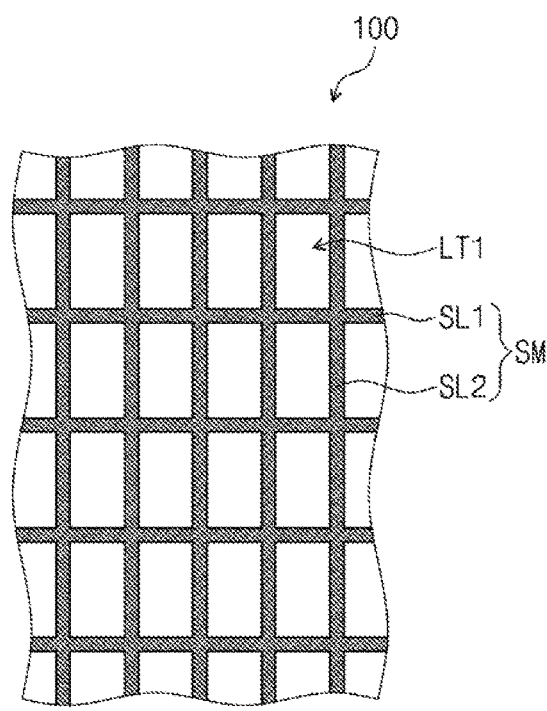

Referring to FIGS. 9A, 10A, and 10B, a preliminary sealing member SM-0 may be disposed onto the display substrate 100 using a dispenser DP. Here, the mask MK disposed on the display substrate 100 may transfer a shape of the mask hole MH of the mask MK onto the preliminary sealing member SM-0 disposed onto the display substrate 100. For example, the preliminary sealing member SM-0 may be disposed onto the display substrate 100 through the mask hole MH of the mask MK. Since, as described above, the mask hole MH is formed to correspond to the sealing area/region SA of the display substrate 100, the preliminary sealing member SM-0 may be formed on the sealing area/region SA of the display substrate 100.

Here, the preliminary sealing member SM-0 may include an uncured frit, and in some exemplary embodiments of the present inventive concept, the preliminary sealing member SM-0 may be disposed in the form of a viscous liquid material, in which a resin is further included in addition to the frit.

Furthermore, after providing the preliminary sealing member SM-0 onto the mask MK, an additional process may be further performed to move a blade on the mask MK horizontally, and in this case, the mask hole MH may be more efficiently filled with the preliminary sealing member SM-0.

Owing to the shape of the auxiliary holes AH in the mask hole MH, an initial shape of the preliminary sealing member SM-0 formed on the display substrate 100 may have a cross shape, as shown in FIG. 10A. However, in the case where the preliminary sealing member SM-0 is disposed in the form of a viscous liquid material, the preliminary sealing member SM-0 may be reflowed on the display substrate 100. Accordingly, the cross-shaped patterns of the preliminary sealing member SM-0 may be connected to each other to form the sealing member SM, as shown in FIG. 10B. As a result of the reflow, the sealing member SM formed on the display substrate 100 may include the first sealing lines SL1 and the second sealing lines SL2, which are formed to cross each other.

FIGS. 11A and 11B are diagrams illustrating a method of forming the sealing member SM of FIG. 5 on the display substrate 100, according to exemplary embodiments of the present inventive concept.

Referring to FIG. 11A, first sealing lines SL1 may be formed on the display substrate 100 using a first mask MK1. For example, the first mask MK1 may include first mask patterns LP1, which extend in the first direction D1 and are spaced apart from each other in the second direction D2. Accordingly, a first mask hole LH1 elongated in the first direction D1 may be defined between an adjacent pair of the first mask patterns LP1.

The first mask MK1 may be disposed on the display substrate 100 and then, a preliminary sealing member may be disposed onto the display substrate 100 through the first mask MK1 using a dispenser. In this case, similar to that of the previous embodiments of FIG. 9A, a first sealing line SL having a shape corresponding to the first mask hole LH1 may be formed on the display substrate 100.

Referring to FIG. 11B, second sealing lines SL2 may be formed on the display substrate 100 using a second mask MK2. For example, the second mask MK2 may include second mask patterns LP2, which extend in the second direction D2 and are spaced apart from each other in the first direction D1. Accordingly, a second mask hole LH2 elongated in the second direction D2 may be defined between an adjacent pair of the second mask patterns LP2.

Thereafter, the second mask MK2 may be disposed on the display substrate 100 disposed with the first sealing lines SL and then a preliminary sealing member may be disposed onto the display substrate 100 through the second mask MK2 using a dispenser. In this case, second sealing lines SL2 having a shape corresponding to the second mask hole LH2 may be formed on the display substrate 100. As a result, the sealing member SM may be formed on the display substrate 100, and the sealing member SM may include the first sealing lines SL1 and the second sealing lines SL2, which are formed to cross each other.

Figure 12A:
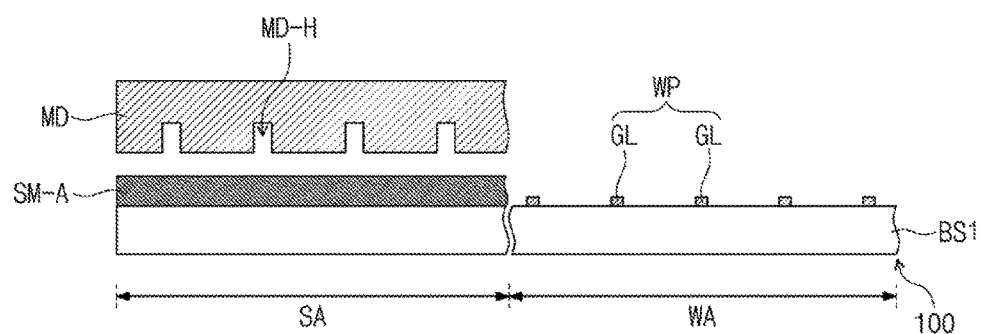
FIGS. 12A, 12B, and 12C are diagrams illustrating a method of forming the sealing member of FIG. 6 on a display substrate, according to exemplary embodiments of the present inventive concept.
Figure 12B:
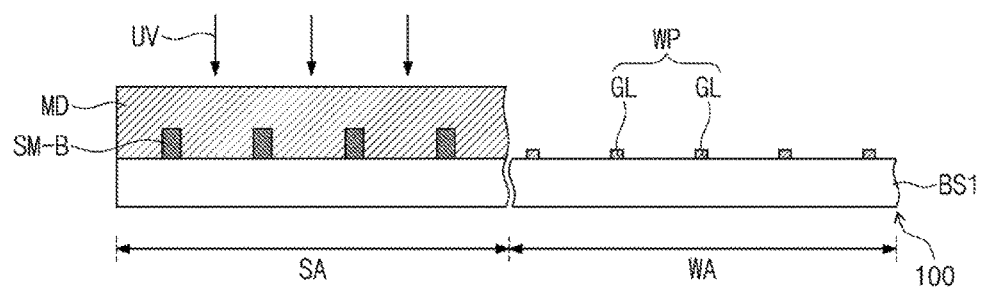
Figure 12C:
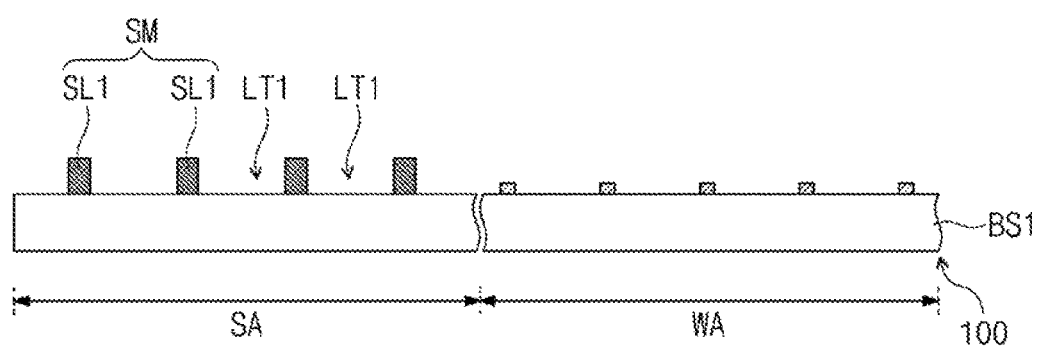

FIGS. 12A, 12B, and 12C are diagrams illustrating a method of forming the sealing member SM of FIG. 6 on the display substrate 100, according to exemplary embodiments of the present inventive concept.

Referring to FIG. 12A, a first preliminary sealing member SM-A may be formed on the sealing area/region SA of the first base substrate BS1 of the display substrate 100. Here, the first preliminary sealing member SM-A may include an uncured frit, and in certain embodiments, the first preliminary sealing member SM-A may be disposed in the form of a viscous liquid material, in which a resin and a photoinitiator are further included, in addition to the frit.

Here, grooves MD-H may be formed in a mold MD. The grooves MD-H may be respectively formed at positions corresponding to the sealing member SM of FIG. 6. The mold MD may be formed of or include at least one transparent plastic material (e.g., polycarbonate).

Referring to FIGS. 12B and 12C, an imprinting process using the mold MD may be performed on the first preliminary sealing member SM-A. As a result, the first preliminary sealing member SM-A may be patterned to form a second preliminary sealing member SM-B which has a shape corresponding to that of the mold MD.

Thereafter, the mold MD that is coupled to the second preliminary sealing member SM-B may be irradiated with ultraviolet (UV) light. The second preliminary sealing member SM-B may be cured as a result of the reaction between the ultraviolet UV light and the photoinitiator, and the sealing member SM may be formed to have a patterned structure.

According to some exemplary embodiments of the present inventive concept, light openings may be defined in a sealing member which is disposed in a sealing area/region of a transparent display device. This may make it possible to increase optical transmittance of the transparent display device at an area/region corresponding to the sealing area/region and to increase a measure of the resulting transparency of the transparent display device.

While exemplary embodiments of the present inventive concept have been particularly shown and described, it will be understood by one of ordinary skill in the art that variations in form and detail may be made therein without departing from the spirit and scope of the disclosure.

What is claimed is:

1. A transparent display device, comprising:
   a display substrate including a display region and a sealing region surrounding the display region, the display region comprising a plurality of pixel regions, each of which includes a light-emitting region and a transparent region;
   an opposite substrate facing the display substrate; and
   a sealing member interposed between the display substrate and the opposite substrate, the sealing member overlapping the sealing region, the sealing member bonding the display substrate to the opposite substrate and including a plurality of first light openings defined therein.

2. The transparent display device of claim 1, wherein the sealing member extends along a border of the display substrate and extends along a border of the opposite substrate, and the plurality of first light openings are spaced apart from each other in length and width directions of the sealing member.

3. The transparent display device of claim 2, wherein the sealing member comprises:
   a plurality of first sealing lines spaced apart from each other; and
   a plurality of second sealing lines spaced apart from each other and crossing the plurality of first sealing lines, wherein the plurality of first light openings is defined by the plurality of first sealing lines and the plurality of second sealing lines.

4. The transparent display device of claim 3, wherein each of the plurality of first light openings is defined by an adjacent pair of first sealing lines of the plurality of first sealing lines and an adjacent pair of second sealing lines of the plurality of second sealing lines.

5. The transparent display device of claim 2, wherein the sealing member comprises a plurality of sealing lines crossing each other, and the plurality of sealing lines comprises a plurality of outermost sealing lines and a plurality of rest sealing lines, wherein each of the plurality of the outermost sealing lines is located at an outermost region of the display substrate, wherein the plurality of the rest sealing lines are located inner than the plurality of the outermost sealing lines, and wherein each of the plurality of the outermost sealing lines has a width larger than that of each of the plurality of the rest sealing lines.

6. The transparent display device of claim 2, wherein, an area of each of the pixel regions is substantially equal to that of each of the plurality of first light openings.

7. The transparent display device of claim 2, wherein, a shape of each of the pixel regions is substantially the same as that of each of the plurality of first light openings.

8. The transparent display device of claim 2, wherein the display substrate further comprises a wiring region disposed between the display region and the sealing region, and the transparent display device further comprises a plurality of wires, which is disposed in the wiring region and is electrically connected to pixels disposed on the plurality of pixel regions, and the opposite substrate comprises a first light-blocking pattern, which overlaps the plurality of wires at the wiring region, and in which a plurality of second light openings are defined.

9. The transparent display device of claim 8, wherein the plurality of second light openings are spaced apart from each other in both the length and width directions of the sealing member.

10. The transparent display device of claim 9, wherein, when viewed in a plan view, an area of each of the plurality of second light openings is substantially equal to that of each of the plurality of first light openings.

11. The transparent display device of claim 9, wherein, a shape of each of the plurality of second light openings is substantially the same as that of each of the plurality of first light openings.

12. The transparent display device of claim 8, wherein the plurality of wires extends from the wiring region toward the display region, and the opposite substrate further comprises a second light-blocking pattern, which overlaps the plurality of wires at the display region, and in which a plurality of third light openings are defined.

13. The transparent display device of claim 12, wherein the plurality of third light openings are spaced apart from each other in both the length and width directions of the sealing member.

14. The transparent display device of claim 12, wherein, an area of each of the plurality of third light openings is substantially equal to that of each of the plurality of first light openings or each of the plurality of second light openings.

15. The transparent display device of claim 12, wherein, a shape of each of the plurality of third light openings is substantially the same as that of each of the plurality of first light openings or each of the plurality of second light openings.

16. The transparent display device of claim 8, wherein each of the pixels comprises an organic light emitting device.

17. The transparent display device of claim 2, wherein the sealing member comprises a plurality of sealing lines crossing each other, and wherein each of the plurality of sealing lines are increasingly thinner in an inward direction thereof toward an inner region of the display substrate.

18. The transparent display device of claim 1, wherein the sealing member comprises a frit.

19. The transparent display device of claim 1, wherein the sealing member has a mesh shape.

20. A transparent display device, comprising:
a first substrate;
a second substrate;
a sealing member extended along an edge of the first substrate, the sealing member sealing the first substrate to the second substrate; and
a plurality of pixels disposed on the first substrate, each of which includes a light-emitting region configured to generate an image and a light-transmitting region configured to pass external light therethrough,
wherein the sealing member is configured to transmit light therethrough along the edge of the first substrate.

* * * * *